(12) United States Patent
Chao et al.

(10) Patent No.: US 9,594,641 B2
(45) Date of Patent: Mar. 14, 2017

(54) TECHNIQUES FOR UPDATING MEMORY OF A CHASSIS MANAGEMENT MODULE

(71) Applicant: GLOBALFOUNDRIES INC., Grand Cayman (KY)

(72) Inventors: Hsu-Ming Chao, Taipei (TW); Ai-Yu Cheng, Miaoli County (TW); Tsung-Hsuan Hsieh, Taipei (TW); Tsung-Kuel Liao, Taipei (TW)

(73) Assignee: GLOBALFOUNDRIES INC., Grand Cayman (KY)

( * ) Notice: Subject to any disclaimer, the term of this patent is extended or adjusted under 35 U.S.C. 154(b) by 148 days.

(21) Appl. No.: 14/465,248

(22) Filed: Aug. 21, 2014

(65) Prior Publication Data
US 2015/0058538 A1    Feb. 26, 2015

(30) Foreign Application Priority Data

Aug. 23, 2013    (TW) .............................. 102130228 A

(51) Int. Cl.
*G06F 12/12* (2016.01)
*G06F 11/14* (2006.01)
*H05K 7/14* (2006.01)

(52) U.S. Cl.
CPC ....... *G06F 11/1451* (2013.01); *H05K 7/1494* (2013.01); *H05K 7/1498* (2013.01); *G06F 2201/84* (2013.01); *G06F 2212/7207* (2013.01)

(58) Field of Classification Search
CPC  G06F 11/1666; G06F 2201/84; H05K 7/1498
USPC ......................................................... 711/103
See application file for complete search history.

(56) References Cited

U.S. PATENT DOCUMENTS

| | | | |
|---|---|---|---|
| 7,844,768 B2 | 11/2010 | Tanaka | |
| 8,074,108 B2 | 12/2011 | Shirogane et al. | |
| 2003/0191916 A1* | 10/2003 | McBrearty | G06F 11/1464 |
| | | | 711/162 |
| 2006/0232552 A1 | 10/2006 | Chung | |
| 2009/0177808 A1* | 7/2009 | Park | G06F 13/4081 |
| | | | 710/19 |
| 2013/0094348 A1 | 4/2013 | Armstrong et al. | |

FOREIGN PATENT DOCUMENTS

| | | |
|---|---|---|
| CN | 103279260 A | 9/2013 |
| TW | 200825760 A | 6/2008 |

(Continued)

OTHER PUBLICATIONS

Office Action dated Apr. 13, 2016 received in related U.S. Appl. No. 14/522,848.

*Primary Examiner* — Jae Yu
(74) *Attorney, Agent, or Firm* — Scully Scott Murphy and Presser; Frank Digiglio

(57) ABSTRACT

A technique for data roll-back includes in response to a first external static memory device being coupled to a first chassis management module and the first chassis management module being coupled to a middle plane board, determining whether the first external static memory device operates normally. In response to the first external static memory device operating normally, a controller of the first chassis management module writes data in the first external static memory device into a non-volatile memory of the first chassis management module to perform data roll-back.

11 Claims, 5 Drawing Sheets

(56) References Cited

FOREIGN PATENT DOCUMENTS

| TW | 2000825760 A | 6/2008 |
| TW | 200949546 A | 12/2009 |
| TW | 201024958 A | 7/2010 |

* cited by examiner

TECHNIQUES FOR UPDATING MEMORY OF A CHASSIS MANAGEMENT MODULE

This application claims priority to Taiwanese Patent Application 102130228, entitled "ELECTRONIC APPARATUS AND DATA ROLLING BACK METHOD THEREFOF," filed on Aug. 23, 2013. The disclosure of Taiwanese Patent Application 102130228 is hereby incorporated herein by reference in its entirety for all purposes.

BACKGROUND

The disclosure relates to updating memory and, more specifically, to techniques for updating memory of a chassis management module.

Each of a wide variety of conventional electronic apparatuses consists of components arranged in an array. As one example, a blade server system comprises a plurality of blade servers arranged in an array. The blade server system usually has a whole chassis and provides various functions, such as power supply, computation, communication, and heat dissipation, in a centralized and united manner. As such, the blade sever system is a high-density system.

In general, the numerous blade servers (calculation nodes) are disposed in the front of a chassis to enhance convenience for a user and an administrator. A chassis management module (CMM), a fan, and a power supply have been disposed at the back of the chassis. In general, the blade servers, the fan, the power supply, and the chassis management module are designed to be hot-swappable to enhance serviceability. The design requires a middle board for supporting the hot swapping of the blade servers, the fan, the power, and the chassis management module.

The middle board is electrically connected to each of the components through a connector so as to transmit power signals, control high-speed signals, and control low-speed signals. The middle board usually has a non-volatile memory, including but not limited to a flash read-only memory (ROM) or an electrically erasable programmable read-only memory (EEPROM). The non-volatile memory stores therein unerasable codes, including but not limited to vital product data (VPD) that includes, for example, data pertaining to control, manufacturing, parts and components. Typical VPD comprises a part number, a serial number, a product model number, a product version, a maintenance level, and the other specific information. Alternatively, VPD further comprises user-defined information. After a user has replaced the chassis management module, VPD data in the non-volatile memory of the middle board is accessible through the system, such that maintenance technicians or R&D engineers can perform data analysis.

The non-volatile memory is an active component. The active component is defined as an electronic component adapted to effectuate a gain in an electrical circuit, so as to perform active functions such as amplifying or oscillating when supplied with power. Persons skilled in the art understand that active components mounted on a circuit board are susceptible to being damaged and becoming unreliable, thereby shortening the service life of the circuit board.

As its name indicates, the middle board is positioned centrally at the blade server system. It is difficult to perform maintenance operation on the middle board in front or back of the chassis. As a result, to maintain or replace the middle board it has been necessary to remove the chassis and then remove parts and components from the blade server system. Furthermore, when the middle board is damaged, it is difficult and inconvenient to read the data in the non-volatile memory of the middle board. As such, the serviceability of the conventional middle board is unsatisfactory in particular due to the non-volatile memory or other active components in use. The short service life of the conventional middle board causes many technical support problems.

BRIEF SUMMARY

A technique for data roll-back includes in response to a first external static memory device being coupled to a first chassis management module and the first chassis management module being coupled to a middle plane board, determining whether the first external static memory device operates normally. In response to the first external static memory device operating normally, a controller of the first chassis management module writes data in the first external static memory device into a non-volatile memory of the first chassis management module to perform data roll-back.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings, in which.

DETAILED DESCRIPTION

Figure 1:
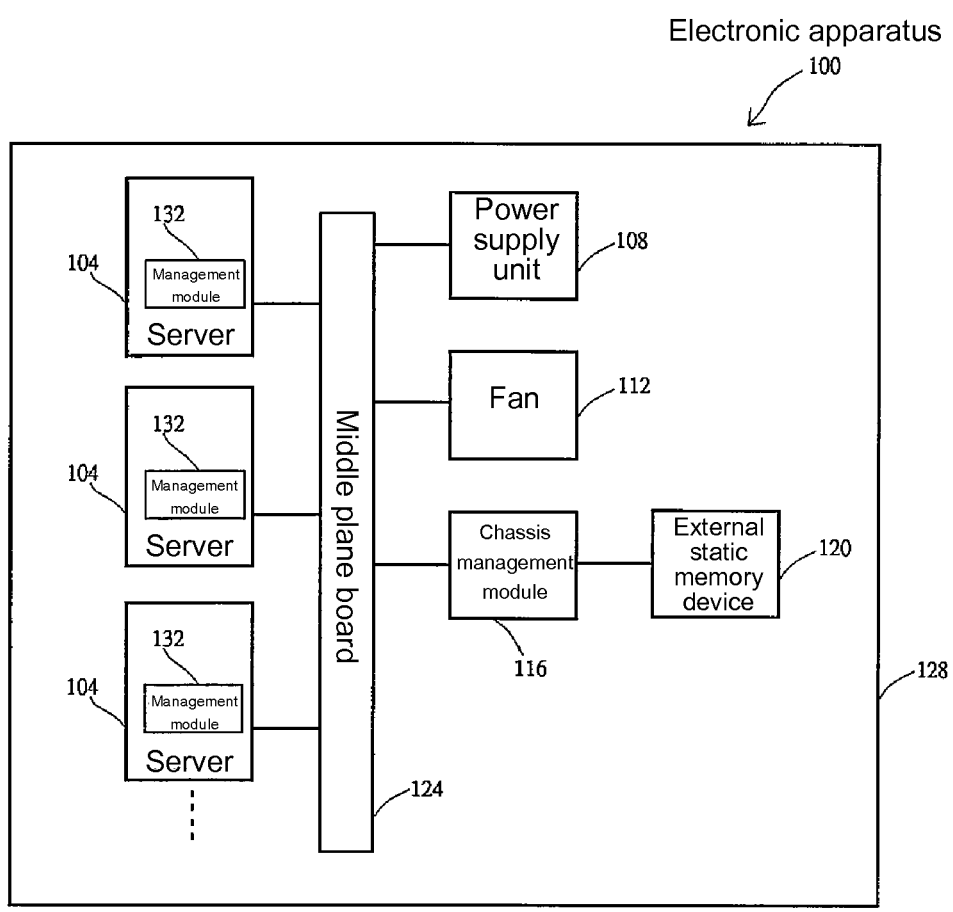
FIG. 1 is a block diagram of an exemplary hardware framework of an electronic apparatus configured according to an embodiment of the present disclosure.

The illustrative embodiments provide techniques for updating memory of a chassis management module.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

It should be understood that the use of specific component, device, and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. As may be used herein, the term 'coupled' may encompass a direct connection between components or elements or an indirect connection between components or elements utilizing one or more intervening components or elements.

The present disclosure discloses technology pertaining to an electronic apparatus that includes components arranged in an array with high-serviceability and high-reliability. The various embodiments disclose user-friendly solutions. In an embodiment, an electronic apparatus is disclosed that includes: a chassis; a middle plane board which is disposed in the chassis and has a first side; a server electrically coupled to the middle plane board; a chassis management module which is electrically coupled to the first side of the middle plane board in an extractable and insertable way and stores data related to components in the chassis; and an external static memory device electrically coupled to the chassis management module in an extractable and insertable way.

An update of the data related to the components in the chassis is stored in the external static memory device in response to the electrical coupling of the external static memory device to the chassis management module and the electrical coupling of the chassis management module to the middle plane board. A first middle plane board slot may be disposed on the first side and the chassis management module is electrically coupled to the first middle plane board slot of the middle plane board in a hot-swap way. The chassis management module may comprise a chassis management module slot and the external static memory device is electrically coupled to the chassis management module slot in a hot-swap way.

The middle plane board may further have a second side opposite to the first side and the server is electrically coupled to the first side or the second side of the middle plane board in an extractable and insertable way. A second middle plane board slot may be disposed on the second side and the server is electrically coupled to the second middle plane board slot of the middle plane board in a hot-swap way. A third middle plane board slot may be disposed on the first side and the server is electrically coupled to the third middle plane board slot of the middle plane board in a hot-swap way. The chassis management module may comprise a controller and a non-volatile memory and the update of the data related to the components in the chassis may be stored in the external static memory device by the controller. The external static memory device may be extracted from the chassis management module and inserted into a second chassis management module.

Data in the external static memory device is written by the controller into a corresponding portion of the non-volatile memory to perform data roll-back in response to the electrical coupling of the second chassis management module to the middle plane board. The server may comprise a management module and the chassis management module retrieves an operation state of the server from the management module of the server and monitors and manages the server according to the operation state.

In another embodiment, a data roll-back method applicable in an electronic apparatus is disclosed. The electronic apparatus comprises a chassis, a middle plane board, a server electrically coupled to the middle plane board, a first chassis management module electrically coupled to the middle plane board in an extractable and insertable way, and a first external static memory device electrically coupled to the first chassis management module in an extractable and insertable way. The first chassis management module comprises a controller and a non-volatile memory.

The method may comprise: inserting the first external static memory device into the first chassis management module for electrical coupling thereof; inserting the first chassis management module into the middle plane board for electrical coupling thereof; examining whether the first external static memory device operates normally by means of the first chassis management module; writing data which is in the first external static memory device into a corresponding portion of the non-volatile memory by the controller to perform data roll-back in response to a normal operation of the first external static memory device.

The data roll-back method may further comprise: examining whether the first chassis management module operates normally; and removing the first external static memory device from the first chassis management module, inserting the first external static memory device into a second chassis management module operating normally, and rolling back data, which is in the first external static memory device, into the second chassis management module by a controller of the second chassis management module in response to an abnormal operation of the first chassis management module.

The data roll-back method may further comprise: sending from the first chassis management module a message indicating an abnormal operation of the first external static memory device in response to the abnormal operation of the first external static memory device. The data roll-back method may further comprise: extracting the first external static memory device from the first chassis management module and inserting a second external static memory device capable of operating normally into the first chassis management module in response to the message indicating the abnormal operation of the first external static memory device.

An update of data related to components in the chassis is stored in the first external static memory device in response to the insertion of the first external static memory device into the first chassis management module for electrical coupling thereof and the insertion of the first chassis management module into the middle plane board for electrical coupling thereof. A user examines whether the first chassis management module operates normally by an indication of an indicator of the first chassis management module.

Referring to FIG. 1, an exemplary hardware framework of an electronic apparatus 100, configured according to an embodiment of the present disclosure, is shown. The electronic apparatus 100 comprises a plurality of servers 104, a power supply unit 108, a fan 112, a chassis management module 116, an external static memory device 120, a middle plane board 124, and a chassis 128. The electronic apparatus 100 is illustrative rather than restrictive of the present invention and the servers 104 can be of different types.

In an embodiment, the electronic apparatus 100 may be, but is not limited to, a blade server system. Each of the servers 104 may be, but are not limited to, blade servers and are electrically coupled to the middle plane board 124. The quantity of the servers 104 is subject to change as needed. The servers 104 perform data transmission and processing with the chassis management module 116, according to the type of data and the way the data is processed. Each of the servers 104 is electrically coupled to the middle plane board 124. In general, the middle plane board 124 is a circuit board and connectors can be disposed on two sides thereof. Each of the components can be electrically coupled to the middle plane board 124 in a hot-swap way. In an embodiment, the blade servers 104 and the other components are electrically coupled to the middle plane board 124 through high-pin-density connectors. The pins may transmit universal serial bus (USB) signals, high-speed signals, low-speed signals, and power signals. The servers 104 are disposed in front of the middle plane board 124 of the electronic apparatus 100.

To enhance their serviceability, the servers 104 can be hot-swappable. In an embodiment, each of the servers 104 comprises a management module 132, including but not limited to, an integrated management module (IMM) or a baseboard management controller (BMC). The management modules 132 manage the servers 104 through individual interfaces for performing functions, including but not limited to power management, system state detection, event screening, power management, event occurrence logs, and system restore control. In an embodiment, each of the management modules 132 comprises a microprocessor and a memory (not shown). For example, the baseboard management controller integrated with a motherboard (not shown) of each of the servers 104 can be referred to Maxim's VSC452 baseboard management controller or ServerEngines' SE-SM4210-P01 baseboard management controller and further modified or extended.

Depending on a sensor mounted on a corresponding one of the servers 104, each of the baseboard management controllers can obtain a temperature parameter, a voltage parameter, a power consumption parameter, or an operation state of the various combination of the parameters, so as to monitor the information related to real-time operation of the corresponding server 104 and a system condition. The chassis management module 116 retrieves the operation state of each of the servers 104 from the baseboard management controller 132 of each of the servers 104 through the middle plane board 124. Hence, the chassis management module 116 can communicate with the baseboard management controllers 132 of the servers 104 and obtain the operation states from the baseboard management controllers 132. After having obtained the operation states of the servers 104, the chassis management module 116 further monitors and manages the servers 104 according to the operation states.

Likewise, the aforesaid monitoring function performed by the chassis management module 116 also applies to the other components of the electronic apparatus 100. For instance, the chassis management module 116 monitors and manages the fan 112 according to the operation states. In an embodiment, through a port (not shown), the chassis management module 116 communicates with a baseboard management controller (not shown) of the fan 112 and controls its rotational speed. The baseboard management controller retrieves the real-time operating rotational speed of the fan 112 and forwards it to the chassis management module 116. After having obtained the operation states, such as the internal temperature or the temperature at the other parts, of the servers 104, the chassis management module 116 regulates the rotational speed of the fan 112 in real-time.

In another embodiment, one of the management modules 132 is an integrated management module, for example. The constituent elements of the integrated management module are similar to those of the baseboard management controller and include an integrated management module firmware (IMM firmware) (not shown) of a server 104, which substitutes for the baseboard management controller to integrate server processor functionality, super I/O, video controller, and remote functionality into a chip (not shown) mounted on the motherboard of the server 104. Moreover, the integrated management module firmware may include the commands and routines that execute disclosed functionalities. In an embodiment, the management module 132 may be an iMM controller for use in IBM™ products. In another embodiment, depending on related needs, the management module 132 further comprises a remote control program (not shown) and an Intelligent Platform Management Interface (IPMI, not shown) utility.

In another embodiment, the blade server system 100 further comprises an optical fiber module (not shown) for transmitting data processed by the servers 104, a switch server (not shown) for transmitting RJ45 network signals, and a display unit (not shown) for displaying the condition of components in the blade server system 100. Each of the aforesaid components is attributed to the prior art and well known among persons skilled in the art, and thus is not described further herein for the sake of brevity. Related operations and details of the components of the electronic apparatus 100 are explained later. The power 108, the fan 112, the chassis management module 116, or related ones of the servers 104 can be disposed behind the middle plane board 124 of the electronic apparatus 100.

To enhance serviceability, the components (including the power 108, the fan 112, the chassis management module 116, or related ones of servers 104) are coupled to the middle plane board 124 and are hot-swappable. The external static memory device 120 includes, but is not limited to, a USB key in which a plurality of data is stored. The USB key 120 is electrically coupled to the chassis management module 116 in an extractable and insertable way and engaged in communication, which takes place through an external port of the chassis management module 116.

Figure 2:
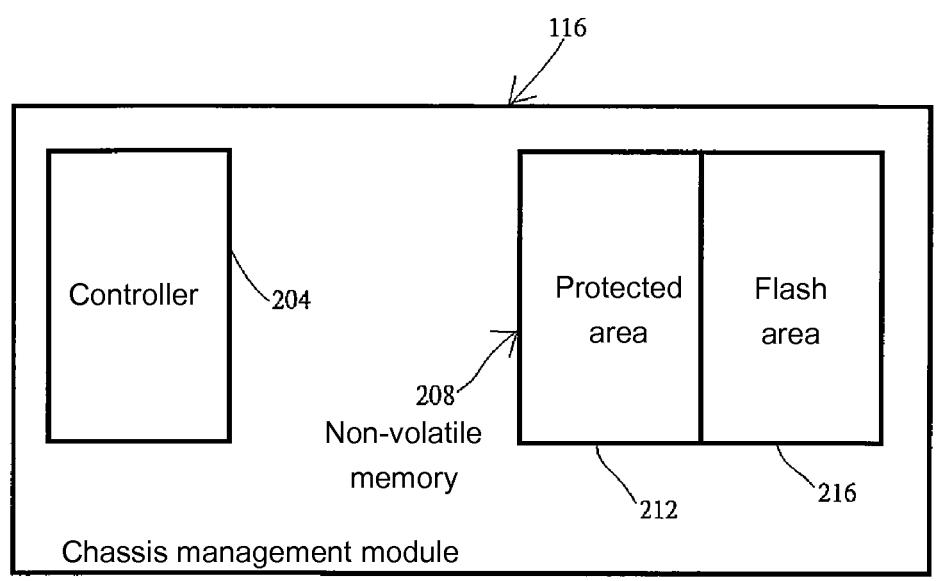
FIG. 2 is a block diagram of a chassis management module configured according to an embodiment of the present disclosure.

With brief reference to FIG. 2, data stored in a non-volatile memory 208 of the chassis management module 116 and/or updates of the data are backed up in the external static memory device 120. Data stored in the external static memory device 120 can also be rolled back to the non-volatile memory 208 of the chassis management module 116. The related operations and details of the aforesaid data backup and data roll-back are described below. In addition to the USB key, the external static memory device 120 may further comprise a memory device supporting the interface of the chassis management module 116, such as a secure digital memory card (SD memory card), or a device for supporting service provider interface (SPI) or any other memory device.

Referring to FIG. 2, a block diagram of the chassis management module 116 is illustrated. The chassis management module 116, also known as a chassis supporting device, configures and manages parts and components mounted in the chassis 128. The chassis management module 116 comprises a controller 204 and the non-volatile memory 208. The non-volatile memory 208 includes, but is not limited to, a flash ROM or an electrically erasable programmable read only memory (EEPROM). Furthermore, the non-volatile memory 208 is defined with a protected area 212 and a flash area 216. Stored in the protected area 212 is unerasable code including, but not limited to, VPD such as invariable information related to parts, component, and manufacturing. The flash area 216 stores user setting, event logs received via the controller 204, chassis configuration, system control setting, and fan/power supply unit fail information (fan/PSU fail information). The related operations and details of the components of the chassis management module 116 are described below.

Figure 3:
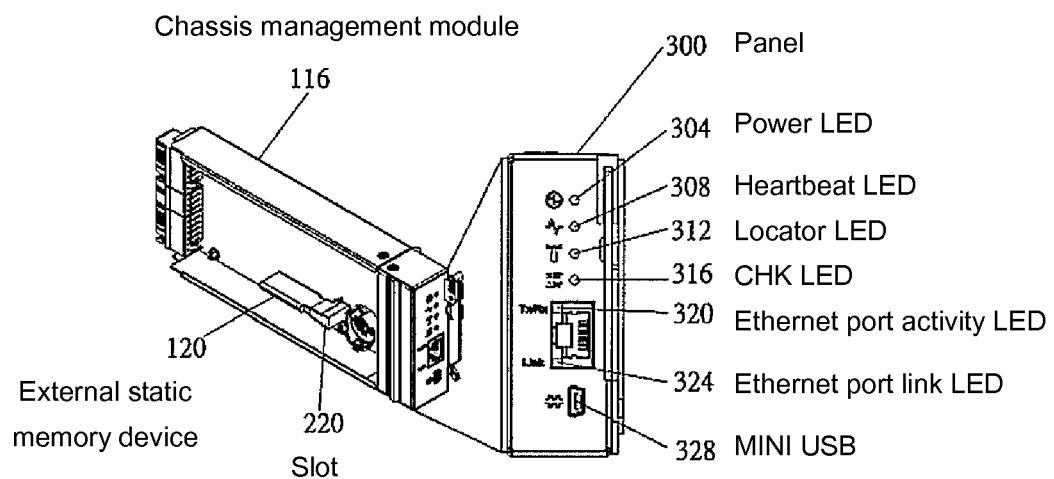
FIG. 3 is a schematic view of a chassis management module configured according to an embodiment of the present disclosure.

FIG. 3 is a schematic view of the chassis management module 116 according to another embodiment. As mentioned, the chassis management module 116 processes a large amount of data in order to configure and manage the components in the chassis 128. The chassis management module 116 has a panel 300. Mounted on the panel 300 are various indicators and ports including, but not limited to, a power light-emitting diode (LED) 304, a heartbeat LED 308, a locator LED 312, a CHK LED 316, an Ethernet port activity LED 320, an Ethernet port link LED 324, and an MINI USB 328. The LEDs indicate various predefined states that are well known among persons skilled in the art and are not described further herein for the sake of brevity.

The chassis management module 116 further comprises at least one slot 220, including, but not limited to, a USB slot. The external static memory device 120 is connected to the chassis management module 116 in a hot-swap way. For example, the external static memory device 120 may include a USB plug (not shown) connectable to the USB slot 220 of the chassis management module 116. The external static memory device 120 is electrically coupled to the chassis management module 116 in a hot-swap way and removable from the chassis management module 116.

Figure 4:
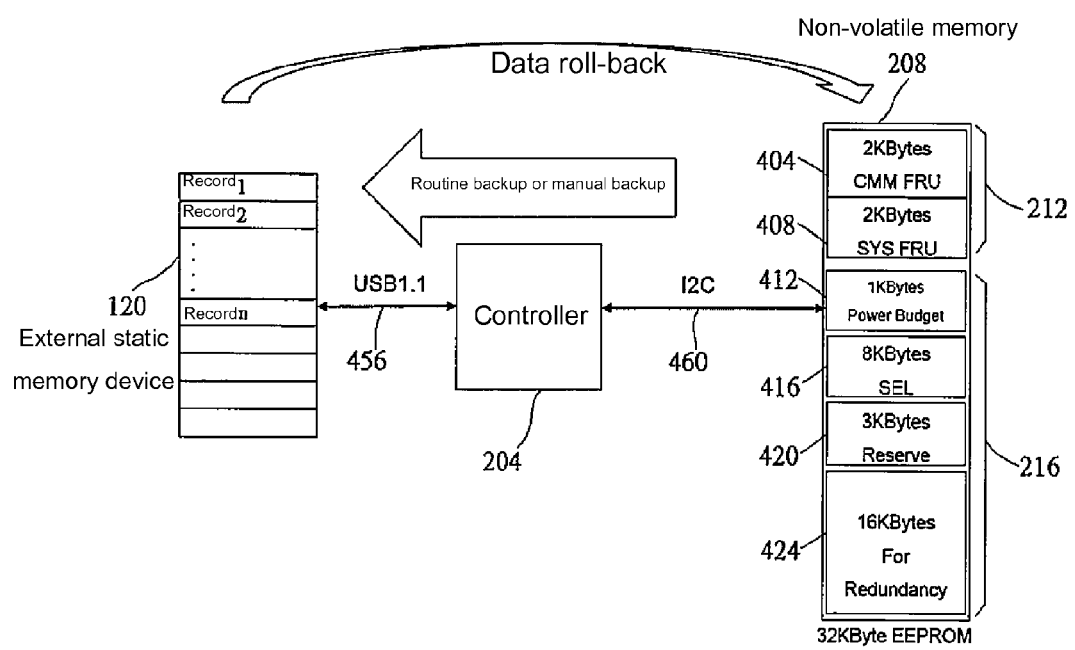
FIG. 4 illustrates data backup and data roll-back between an external static memory device and a non-volatile memory according to an embodiment of the present disclosure.

FIG. 4 illustrates a technique of data backup and data roll-back between the external static memory device 120 and the non-volatile memory 208 (including the protected area 212 and the flash area 216). In one embodiment, the non-volatile memory 208 is a 32 KB EEPROM and is defined with a plurality of data areas. An area 404 stores data (such as a part number) related to a field replaceable unit (FRU) of the chassis management module (CMM), for example. An area 408 stores data (such as a part number) related to a field replaceable unit (FRU) of the system (SYS), for example. The area 404 and the area 408 belong to the protected area 212. An area 412 stores power budget-related data, for example. An area 416 stores event logs in a system event log (SEL) file, for example. An area 420 is a reserve area, for example. An area 424 is a redundancy reserve area, for example. The area 412, area 416, area 420, and area 424 belong to the flash area 216. The area 420 and area 424 store various user setting and various event logs as needed.

In an embodiment, an interface 456 (between the external static memory device 120 and the controller 204) is a USB 1.1 and an interface 460 (between the controller 204 and the non-volatile memory 208) is an inter-integrated circuit (I2C) bus. The external static memory device 120 stores therein a plurality of data (data 1, data 2, data 3 . . . data n). In the event of a change in the data stored in the non-volatile memory (EEPROM) 208, such as a change in user setting or creation of event logs, the changed or updated data can be backed up in the plurality of data in the external static memory device 120 through the operation of the controller 204. There are various methods of backing up the data in the non-volatile memory 208 to the external static memory device 120. For example, backup may include: immediate backup in which backup occurs at the fastest speed possible as soon as a change happens; routine backup which occurs regularly and is configured by a user through a predetermined webpage to decide on the type and quantity of backup data; and conventional manual backup.

In an embodiment, because the routine backup is executed regularly, the routine backup returns to the top of log space to continue with backup whenever all available log space runs out. The backup techniques are attributed to the prior art related to this field and are not further described in detail herein for the sake of brevity. After the external static memory device 120 has been inserted into the chassis management module 116 and the chassis management module 116 has been inserted into the middle plane board 124, data roll-back may occur to the non-volatile memory 208 according to the data stored in the external static memory device 120. In an embodiment, a plurality of data in the external static memory device 120 is written to corresponding portions of the non-volatile memory 208 through the operation of the controller 204 so as to effectuate data roll-back. If the data backup is not finished and the data stored in the external static memory device 120 is incomplete, the controller 204 may execute data roll-back based on a previous version of data stored in the external static memory device 120 and store the event log in the system event log (SEL).

Upon delivery of the electronic apparatus 100, the external static memory device 120 stores delivery data in the protected area 212 only. In an embodiment, the area 404 stores related delivery data of a field replaceable unit of the chassis management module, whereas the area 408 stores related delivery data of a field replaceable unit of the system. The area 404 and area 408 belong to the protected area 212. The area 412, the area 416, the area 420, and the area 424 shown in FIG. 4 do not store any data. After the electronic apparatus 100 has operated for a while, various user setting and various event logs are recorded in the flash area 216 based on actual conditions. Given the data backup methods (i.e. immediate backup, routine backup, manual backup, etc.), updated data of various user setting and various event logs is backed up in the external static memory device 120.

Afterward, if the chassis management module 116 has to be replaced for any reason (for example, the chassis management module 116 has been damaged), the user will only need to remove the external static memory device 120 from the damaged chassis management module 116 and insert the external static memory device 120 into another new chassis management module 116. Meanwhile, the controller 204 of the new chassis management module 116 rolls back the data in the external static memory device 120 to the new chassis management module 116 automatically. A data roll-back method applicable in the electronic apparatus 100 according to an embodiment is illustrated with FIG. 1 through FIG. 4 which show related structures and FIG. 5 which shows a flowchart.

Figure 5:
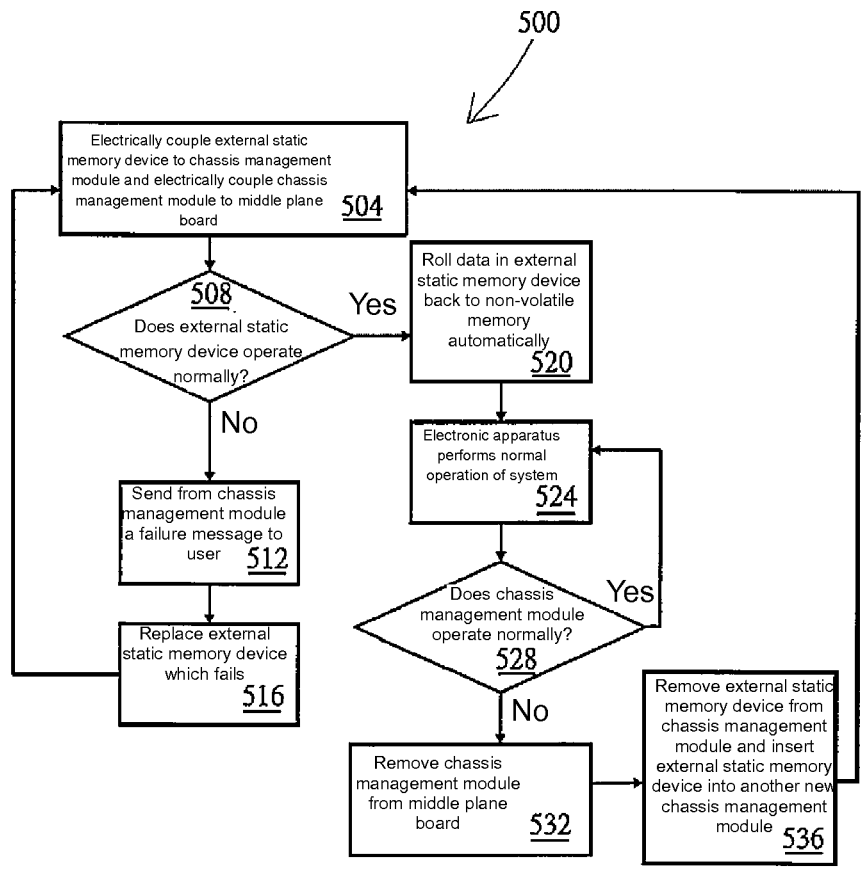
FIG. 5 is a flowchart of a data roll-back process according to an embodiment of the present disclosure.

Referring to FIG. 5, a data roll-back method 500 with respect to the electronic apparatus 100, according to an embodiment, is illustrated. The data roll-back method 500 comprises various blocks. In block 504 the external static memory device 120 is coupled to the chassis management module 116 (for example, in a hot-swap way) and the chassis management module 116 is coupled to the middle plane board 124 (for example, in a hot-swap way). At this point in time, the chassis management module 116 obtains data in the external static memory device 120 and thereby knows the system environment and user settings.

In another embodiment, the chassis management module 116 first reads a segment code in the protected area 212. Smooth reading is indicative of compliance with security mechanism. Then, the chassis management module 116 further obtains all the data in the external static memory device 120. In block 508, the chassis management module 116 examines whether the external static memory device 120 operates normally. The examination includes, but is not limited to, examining whether the initial state of the external static memory device 120 is a healthy state or whether the external static memory device 120 is present. Upon determination that the external static memory device 120 does not operate normally, the process flow of the method goes to block 512. Upon determination that the external static memory device 120 operates normally, the process flow of the method goes to block 520.

In block 512, the chassis management module 116 sends a message indicating an abnormal operation of the external static memory device 120 to a user. In an embodiment, if the chassis management module 116 is unable to write/read to/from the external static memory device 120 or if the chassis management module 116 is unable to detect the presence of the external static memory device 120, the CHK LED 316 (yellow in color, for example) on the panel of the chassis management module 116 is turned on to display a message that the external static memory device 120 fails or is incapable of normal operation. The event log of failure or abnormal operation is also written to the flash area 216 of the non-volatile memory 208.

In block 516, the external static memory device 120 that fails may be replaced by the user. Block 516 is followed by block 504, such that block 504 and subsequent blocks are carried out again. In block 520, data in the external static memory device 120 is automatically rolled back to the non-volatile memory 208 of the chassis management module 116 in response to normal operation of the external static memory device 120. In block 524, normal operation of the system is performed by the electronic apparatus 100. In block 528, the user examines whether the chassis management module 116 operates normally. If the chassis management module 116 does not operate normally, the process flow of the method goes from block 528 to block 532. If the chassis management module 116 operates normally, the process flow of the method goes from block 528 to block 524.

In an embodiment, if the heartbeat LED 308 (for example, green in color) stops flashing, it indicates that the chassis management module 116 is not operating normally. In another embodiment, the chassis management module 116 has a network jack (not shown) and if a remote link does not give any response, it indicates that the chassis management module 116 does not operate normally (for example, the chassis management module 116 fails or is erroneously set). In block 532, the user removes the chassis management module 116 from the middle plane board 124 when the chassis management module 116 does not operate normally. In block 536, the external static memory device 120 is removed from the chassis management module 116 and the external static memory device 120 is inserted into another new chassis management module 116 by the user. The controller 204 of the new chassis management module 116 automatically rolls back data in the external static memory device 120 to the new chassis management module 116.

Then, the process flow of the method goes to block 504, such that block 504 and subsequent blocks are carried out again. In a subsequent block, for example, a typical system operation starts a standby state. The other basic frameworks and components of the electronic apparatus 100 can be referred to conventional personal computers or servers, such as the IBM Blade Center or the like. Hence, details attributed to the electronic apparatus 100 but not related to the present disclosure are omitted from the description.

According to an embodiment, the middle plane board 124 does not have any active component and, thus, is a circuit board having only passive components with high reliability and a long service life. The long service life of the middle plane board 124 reduces the likelihood of the need to replace the middle plane board 124 and to seek support from maintenance technicians. Furthermore, according to the data backup and data roll-back technique disclosed herein, a user can choose different data backup methods for backing up data, such as VPD, various user settings, and various event logs, in the external static memory device 120 as needed. A user can determine that data stored in the external static memory device 120 is real-time and up-to-date. Hence, the external static memory device 120 may be inserted into any other chassis management module 116 and real-time and up-to-date data is then rolled back to the non-volatile memory 208 of the other chassis management modules 116. Furthermore, the external static memory device 120 is advantageously portable and data stored in the external static memory device 120 can be read by appropriate software installed on any computer. Data at a chassis-level may also be easily backed up and transferred. When it is necessary to replace the chassis management module, data in the old chassis management module can be conveniently restored/rolled back to the new chassis management module, thereby dispensing with the hassle of performing any additional settings.

According, techniques have been disclosed herein that advantageously update memory of a chassis management module in an efficient manner.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:
1. An electronic apparatus, comprising:
a chassis;
a middle plane board disposed in the chassis, the middle plane board having a first side;
a server coupled to the middle plane board;

a chassis management module coupled to the first side of the middle plane board in a removable manner, the chassis management module storing data related to components in the chassis; and an external static memory device removably coupled to the chassis management module, wherein an update of the data related to the components in the chassis is stored in the external static memory device in response to the coupling of the external static memory device to the chassis management module and the coupling of the chassis management module to the middle plane board.

2. The electronic apparatus of claim 1, wherein a first middle plane board slot is disposed on the first side and the chassis management module is coupled to the first middle plane board slot of the middle plane board in a hot-swap way, and wherein the chassis management module includes a chassis management module slot and the external static memory device is coupled to the chassis management module slot in a hot-swap way.

3. The electronic apparatus of claim 1, wherein the middle plane board further includes a second side, opposite the first side, and the server is removably coupled to the first side or the second side of the middle plane board.

4. The electronic apparatus of claim 3, wherein a second middle plane board slot is disposed on the second side, and the server is coupled to the second middle plane board slot of the middle plane board in a hot-swap way.

5. The electronic apparatus of claim 4, wherein a third middle plane board slot is disposed on the first side, and the server is coupled to the third middle plane board slot of the middle plane board in a hot-swap way.

6. The electronic apparatus of claim 1, wherein the chassis management module comprises a controller and a non-volatile memory, and wherein the update of the data related to the components in the chassis is stored in the external static memory device by the controller.

7. The electronic apparatus of claim 6, wherein the external static memory device is configured to be removed from the chassis management module and inserted into a second chassis management module, and wherein data in the external static memory device is written by the controller into a corresponding portion of the non-volatile memory to perform data roll-back in response to the coupling of the second chassis management module to the middle plane board.

8. The electronic apparatus of claim 6, wherein the server further comprises a management module, and wherein the chassis management module retrieves an operation state of the server from the management module of the server and monitors and manages the server according to the operation state.

9. The electronic apparatus of claim 8, wherein the management module of the server comprises a baseboard management controller (BMC) or an integrated management module (IMM).

10. The electronic apparatus of claim 1, wherein the non-volatile memory includes a protected area for storing unerasable codes that include vital product data (VPD) and a flash area for storing user setting and event logs.

11. The electronic apparatus of claim 1, wherein the electronic apparatus comprises a blade server system and the server comprises a blade server.

* * * * *